(12) United States Patent
Dell et al.

(10) Patent No.: US 10,209,896 B2
(45) Date of Patent: *Feb. 19, 2019

(54) PERFORMANCE OPTIMIZATION OF READ FUNCTIONS IN A MEMORY SYSTEM

(71) Applicant: International Business Machines Corporation, Armonk, NY (US)

(72) Inventors: Timothy J. Dell, Colchester, VT (US); Saravanan Sethuraman, Bangalore (IN); Diyanesh B. C. Vidyapoornachary, Bangalore (IN)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 148 days.

This patent is subject to a terminal disclaimer.

(21) Appl. No.: 15/291,333

(22) Filed: Oct. 12, 2016

(65) Prior Publication Data
US 2017/0031595 A1    Feb. 2, 2017

Related U.S. Application Data

(63) Continuation of application No. 14/539,277, filed on Nov. 12, 2014, now Pat. No. 9,547,449.

(51) Int. Cl.
*G06F 3/06* (2006.01)
*G06F 11/10* (2006.01)
(Continued)

(52) U.S. Cl.
CPC ............ *G06F 3/061* (2013.01); *G06F 3/0619* (2013.01); *G06F 3/0635* (2013.01);
(Continued)

(58) Field of Classification Search
CPC ...... G06F 11/08; G06F 11/14; G06F 11/1446; G06F 11/16; G06F 11/1666; G06F 11/20;
(Continued)

(56) References Cited

U.S. PATENT DOCUMENTS

2006/0080572 A1* 4/2006 Fong .................... G11C 29/808
714/6.13
2009/0193322 A1* 7/2009 Ishiyama .............. G06F 11/004
714/799

(Continued)

OTHER PUBLICATIONS

List of IBM Patents or Patent Applications Treated as Related (Appendix P), Filed Oct. 18, 2016, 2 pages.
(Continued)

*Primary Examiner* — Gabriel Chu
(74) *Attorney, Agent, or Firm* — Cantor Colburn LLP

(57) ABSTRACT

According to one aspect, a method for performance optimization of read functions in a memory system includes receiving, at the memory system, a read request including a logical address of a target data. The memory system includes a primary memory and a back-up memory that mirrors the primary memory. The method also includes searching a fault monitor table for an entry corresponding to the received logical address. The fault monitor table includes a plurality of entries that indicate physical locations of identified memory failure events in the primary memory and the back-up memory. Based on locating an entry corresponding to the received logical address, the method further includes selecting one of the primary memory and the backup memory for retrieving the target data. The selection is based on contents of the fault monitor table.

10 Claims, 4 Drawing Sheets

(51) Int. Cl.
*G06F 11/16* (2006.01)
*G06F 11/20* (2006.01)
*G11C 29/00* (2006.01)
*G11C 29/04* (2006.01)
*G11C 29/44* (2006.01)
*G11C 29/52* (2006.01)
*G06F 12/1009* (2016.01)

(52) U.S. Cl.
CPC .......... *G06F 3/0644* (2013.01); *G06F 3/0653* (2013.01); *G06F 3/0659* (2013.01); *G06F 3/0673* (2013.01); *G06F 3/0683* (2013.01); *G06F 11/1068* (2013.01); *G06F 11/1666* (2013.01); *G06F 11/2056* (2013.01); *G06F 11/2069* (2013.01); *G06F 11/2087* (2013.01); *G06F 11/2094* (2013.01); *G06F 12/1009* (2013.01); *G11C 29/44* (2013.01); *G11C 29/52* (2013.01); *G11C 29/70* (2013.01); *G11C 29/76* (2013.01); *G11C 29/886* (2013.01); *G06F 2201/805* (2013.01); *G06F 2201/85* (2013.01); *G06F 2201/86* (2013.01); *G11C 2029/0409* (2013.01); *G11C 2029/4402* (2013.01)

(58) Field of Classification Search
CPC ............. G06F 11/2017; G06F 11/2053; G06F 11/2056; G06F 11/2094; G06F 2201/85; G11C 29/00; G11C 29/04; G11C 29/70; G11C 29/88
See application file for complete search history.

(56) References Cited

U.S. PATENT DOCUMENTS

| | | | |
|---|---|---|---|
| 2010/0037102 A1* | 2/2010 | Chen | G11C 29/846 714/42 |
| 2010/0287433 A1* | 11/2010 | Mu | G06F 11/1666 714/746 |
| 2014/0192583 A1* | 7/2014 | Rajan | G11C 7/10 365/63 |
| 2016/0132259 A1 | 5/2016 | Dell et al. | |
| 2016/0132412 A1 | 5/2016 | Dell et al. | |

OTHER PUBLICATIONS

Timothy J. Dell, et al., Pending U.S. Appl. No. 15/291,352 entitled "Performance Optimization of Read Functions in a Memory System" filed with the U.S. Patent and Trademark Office on Oct. 12, 2016.

* cited by examiner

PERFORMANCE OPTIMIZATION OF READ FUNCTIONS IN A MEMORY SYSTEM

DOMESTIC PRIORITY

This application is a continuation of U.S. patent application Ser. No. 14/539,277, filed Nov. 12, 2014, the content of which is incorporated by reference herein in its entirety.

BACKGROUND

The present disclosure relates generally to computer memory, and more particularly, to performance optimization of read functions in a memory system.

Computer systems often require a considerable amount of high speed memory to hold information, such as data and programs, when a computer is powered and operational. Memory systems often maintain a back-up memory that mirrors the data stored in a primary memory, thereby providing a measure of security when the primary memory encounters a memory failure or fault event.

With the increase in memory densities comes an increased probability of encountering a memory failure during normal system operations. Techniques to detect and correct bit errors have evolved into an elaborate science over the past several decades. Perhaps the most basic detection technique is the generation of odd or even parity where the number of 1's or 0's in a data word are "exclusive or-ed" (XOR-ed) together to produce a parity bit. If there is a single error present in the data word during a read operation, it can be detected by regenerating parity from the data and then checking to see that it matches the stored (originally generated) parity.

SUMMARY

According to one embodiment, a method for performance optimization of read functions in a memory system includes receiving, at the memory system, a read request including a logical address of a target data. The memory system includes a primary memory and a back-up memory that mirrors the primary memory. The method also includes searching a fault monitor table for an entry corresponding to the received logical address. The fault monitor table includes a plurality of entries that indicate physical locations of identified memory failure events in the primary memory and the back-up memory. Based on locating an entry corresponding to the received logical address, the method further includes selecting one of the primary memory and the backup memory for retrieving the target data. The selection is based on contents of the fault monitor table.

According to another embodiment, a memory system includes a primary memory, a back-up memory that mirrors the primary memory, a fault management table, and a memory controller operably coupled to the primary memory, the back-up memory, and the fault management table. The memory controller is configured to receive a read request including a logical address of a target data and to search the fault monitor table for an entry corresponding to the received logical address. The fault monitor table includes a plurality of entries that indicate physical locations of identified memory failure events in the primary memory and the back-up memory. Based on locating an entry corresponding to the received logical address, the memory controller is further configured to select one of the primary memory and the backup memory for retrieving the target data. The selection is based on contents of the fault monitor table.

According to a further embodiment, a computer program product for performance optimization of read functions in a memory system is provided. The computer program product includes a computer readable storage medium having program instructions embodied therewith, the program instructions readable by a processing circuit to cause the processing circuit to perform a method. The method includes receiving a read request including a logical address of a target data. The memory system includes a primary memory and a back-up memory that mirrors the primary memory. The method also includes searching a fault monitor table for an entry corresponding to the received logical address. The fault monitor table includes a plurality of entries that indicate physical locations of identified memory failure events in the primary memory and the back-up memory. Based on locating an entry corresponding to the received logical address, the method further includes selecting one of the primary memory and the backup memory for retrieving the target data. The selection is based on contents of the fault monitor table.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Exemplary embodiments are directed to optimizing performance of read functions in a memory system that includes a memory controller, a primary memory, and a back-up memory that mirrors the primary memory in terms of the stored data. The primary memory and the back-up memory may include volatile memory devices (e.g., DRAM) and/or non-volatile memory devices (e.g., Flash). Non-volatile memory can degrade over time, under thermal loads, or due to other effects such that one or more memory failure events can occur. Based on the extent of the failure, an entire chip may be marked as faulty or a portion of the chip may be marked as such. For example, when a few bits associated with a chip are determined to be faulty, a symbol mark may be used to designate the nature of the fault. Likewise, if a significant portion of the chip is determined to be faulty, then a chip mark may be used to designate the nature of the fault.

In exemplary embodiments, memory failure events are discovered and corresponding failure event information is tracked by the memory system. A memory failure event refers to one or more bit errors detected by an error correction code decoder. These errors may have occurred due to data corruption detected at a channel level or corruption in the memory array itself. When a read request is received at the memory system, the failure event information is searched to determine if a physical location corresponding to a logical address provided in the read command is compromised. If so, the memory system is configured to direct the read request to one of the primary memory and the back-up memory based on the failure event information. The failure event information may include physical addresses of memory devices affected by the failure event, an identifier of the primary or back-up memories in which the failure event occurred, a failure event type (e.g., whether the failure event involves an entire chip or a portion thereof), and other desired information, as will be described further herein.

Figure 1:
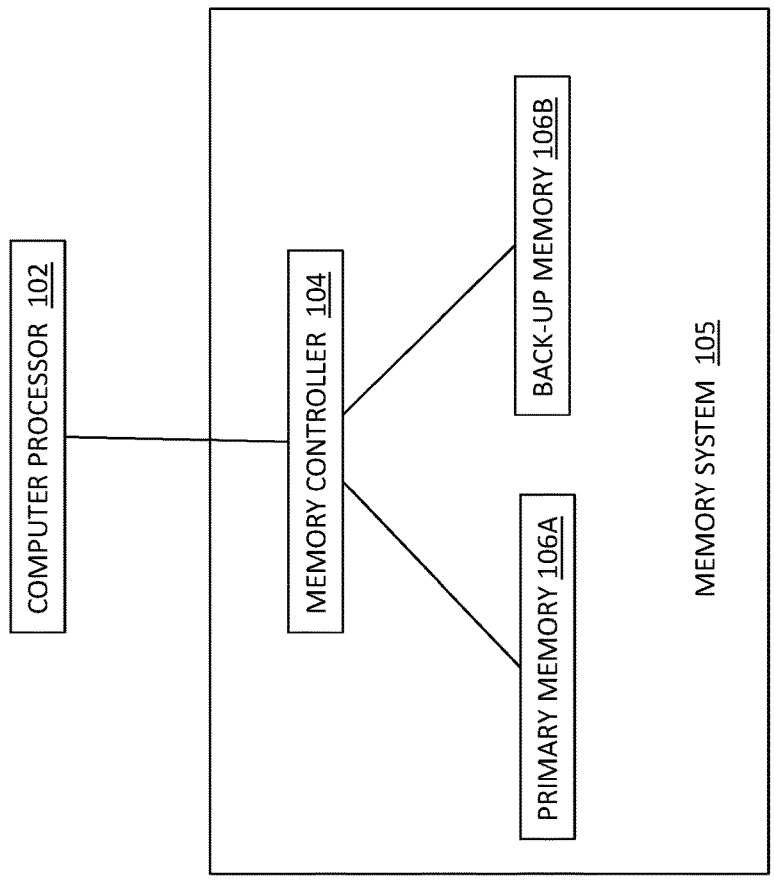
FIG. 1 illustrates a block diagram of a system operable to optimize the performance of read functions in accordance with an embodiment.

FIG. 1 illustrates a block diagram of a system 100 operable to optimize the performance of read functions in a memory system in accordance with an embodiment. The system 100 depicted in FIG. 1 includes a computer processor 102, memories 106A and 106B (each of which includes multiple memory devices), and a memory controller 104. Examples of non-volatile memory devices that can incorporate embodiments as described herein include phase-change memory (PCM), magnetoresistive random-access memory (MRAM), ferroelectric RAM (FeRAM), nonvolatile static RAM (nvSRAM), and restrictive RAM (ReRAM), as well as other non-volatile memory technologies known in the art.

The memories 106A and 106B respectively represent a primary memory and a back-up memory (also referred to as a mirrored memory). The memory controller 104 reads data from the memories 106A and 106B in response to a read request, and may also write data to the memories 106A and 106B in response to a write request. Collectively, the memory controller 104 and the memories 106A and 106B are referred to herein as a memory system 105.

In one embodiment, the memory controller 104 is coupled to the computer processor 102 and receives read requests from the computer processor 102. The read requests contain a logical address for the data to be read from memory. This data to be read from memory is also referred to herein as "target data." The memory controller 104 stores data at a physical address within the primary memory (e.g., 106A) and the back-up memory (e.g., 106B). In an embodiment, the memory controller 104 maps the logical address to a physical address in the memories 106A and 106B when storing or retrieving data.

The system 100 is one example of a configuration that may be utilized to perform the processing described herein. Although the system 100 has been depicted with only the memories 106A/106B, the memory controller 104, and the computer processor 102, it will be understood that other embodiments would also operate in other systems including additional elements, e.g., multiple computer processors 102 and multiple levels of memory. In an embodiment, the memories 106A and 106B, memory controller 104, and computer processor 102 are not located within the same computer. For example, the memories 106A and 106B and memory controller 104 may be located in one physical location while the computer processor 102 is located in another physical location (e.g., the computer processor 102 accesses the memory controller 104 via a network). In addition, portions of the processing described herein may span one or more of the memories 106A and 106B, memory controller 104, and computer processor 102.

Figure 2:
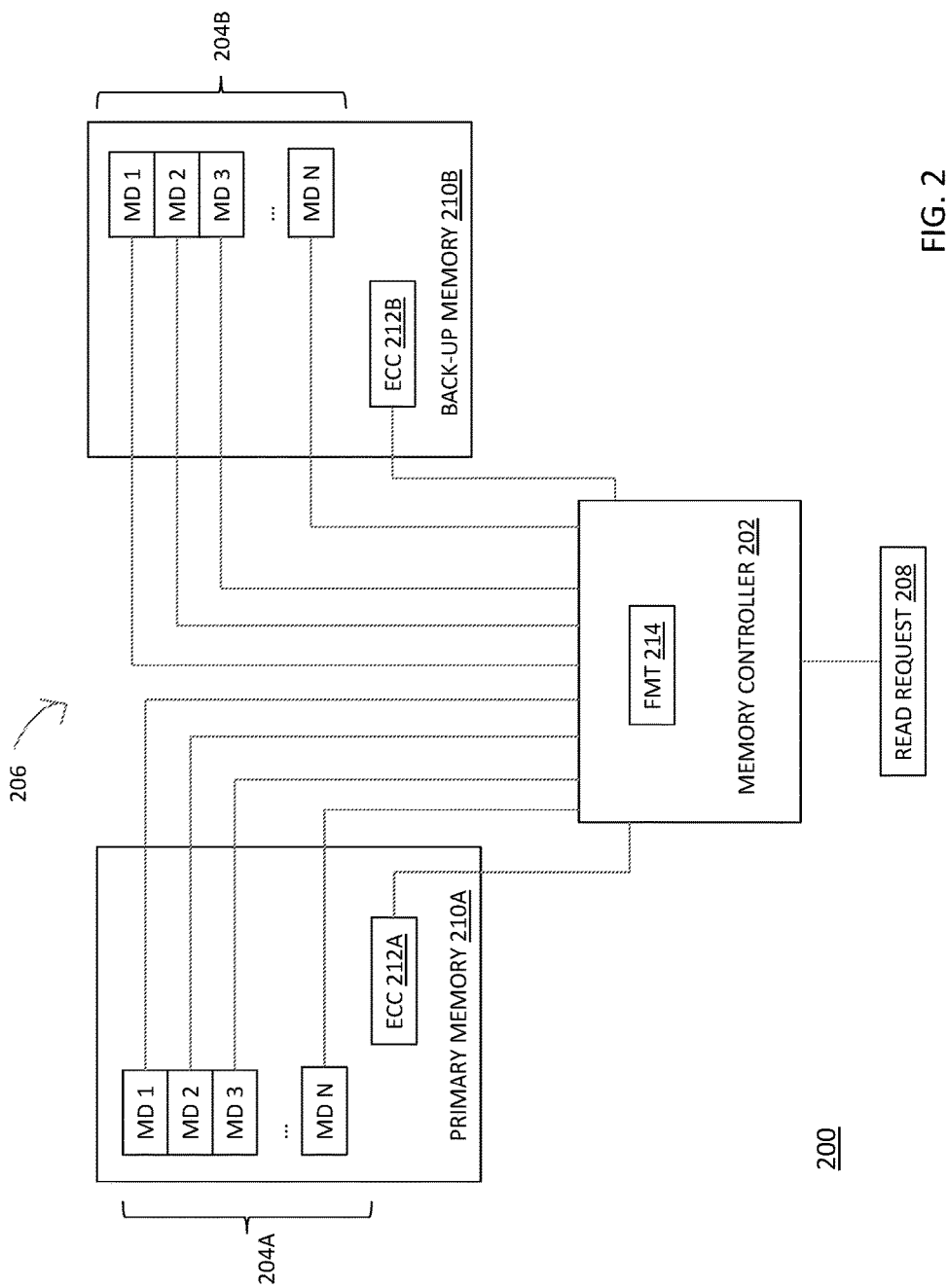
FIG. 2 illustrates a block diagram of a memory system operable to optimize the performance of read functions in accordance with an embodiment.

FIG. 2 illustrates a block diagram of a memory system 200 operable to optimize the performance of read functions in accordance with an embodiment. The memory system 200 is an embodiment of the memory system 105 of FIG. 1. In the example of FIG. 2, memory controller 202 is operably coupled to a primary memory 210A and its memory devices 1-N (collectively, 204A) and also to a back-up memory 210B and its memory devices 1-N (collectively, 204B). The back-up memory 210B is redundant storage and mirrors the data stored in the primary memory 210A.

Command, address, and data buses (collectively "206") enable read and write requests to be issued from the memory controller 202 to the memory devices 204A and 204B. The busses 206 may be implemented as direct memory interface (DMI) channels. A read request 208 may be driven as a discrete signal output from a computer processor to the memory controller 202. Each of the primary memory 210A and the back-up memory 210B may store an error correction code (ECC) unit, respectively 212A and 212B. The ECC units 212A and 212B may further include error correcting logic that performs error detection and corrections for memory failure events.

In an embodiment, the memory controller 202 stores a fault management table (FMT) 214 for tracking memory failure events identified by the ECC units 212A and 212B, e.g., symbol marks and/or chip marks in a memory array or buffer. Each of the memory devices 204A and 204B can assert an indicator based on detecting at least one memory failure event (e.g., chip mark or symbol mark) found in a corresponding memory device. For example, if a memory failure event is detected by ECC unit 212B, the error is reported to the memory controller 202 over the bus 206, along with failure event information and a corresponding physical address of the memory failure event. The FMT 214 stores the physical address of the memory failure event in an entry of the FMT, along with an identifier of the memory (e.g., 210A or 210B). Additional details of the FMT 214 are described further in FIG. 3.

The detected memory failure events are transmitted over busses 206 to the memory controller 202, as will be described further herein. While only a single ECC unit 212A and 212B is shown in each of the memories 210A and 210B, it will be understood that other configurations are possible. For example, a separate ECC unit may be stored in the corresponding memories for each of the memory devices.

Figure 3:
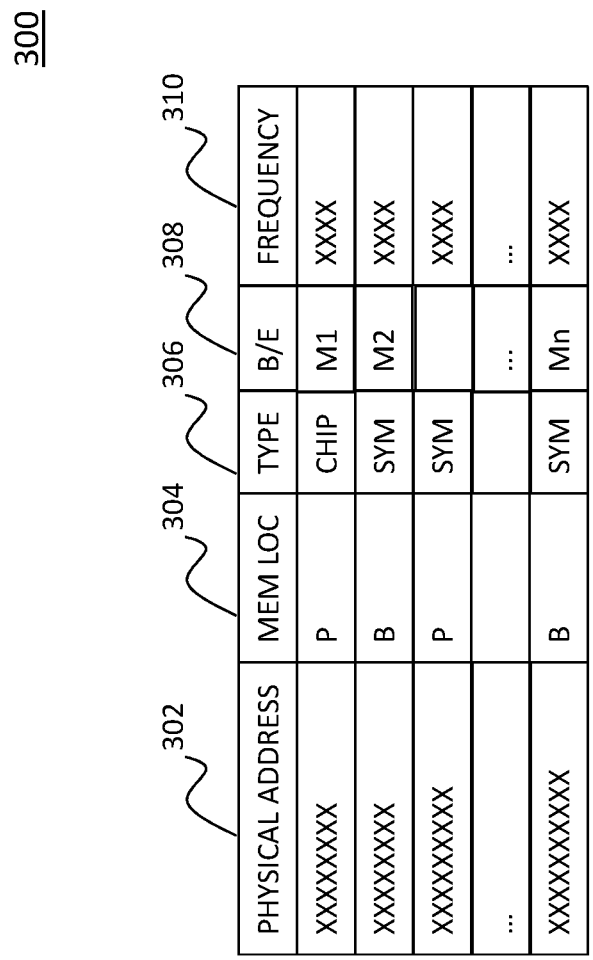
FIG. 3 illustrates a fault management table (FMT) for use in optimizing the performance of read functions in accordance with an embodiment.

As shown in FIG. 3, a FMT 300, which corresponds to FMT 214 of FIG. 2, includes a number of entries, each of which corresponds to a memory failure event identified, e.g., by the ECC units 212A and 212B. A first column 302 specifies a physical address of a memory device corresponding to the memory failure event. A second column 304 specifies in which of the primary memory 210A (labeled "P") and the back-up memory 210B (labeled "B") the memory failure event occurred. A third column 306 specifies the type of memory failure event (e.g., chip mark or symbol mark). A fourth column 308 specifies bit errors (B/E) detected (labeled "M1-Mn"), whereby M1 through Mn indicate bit errors, M1<M2 . . . <Mn. The ECC decoders for the primary and secondary memories have the same level of error correction capabilities. If both primary and secondary memories do not have similar fault conditions, then the controller would choose the memory with the minimum fault (e.g., the memory having fewer bit errors). If both the primary memory and the secondary memory have the same fault conditions, then either the primary or secondary memory may be selected.

A fifth column 310 tracks the number of occurrences of the memory failure event identified for a particular memory device, which memory device can be ascertained based on the physical address. The number of occurrences can be tracked over a specified period of time.

Figure 4:
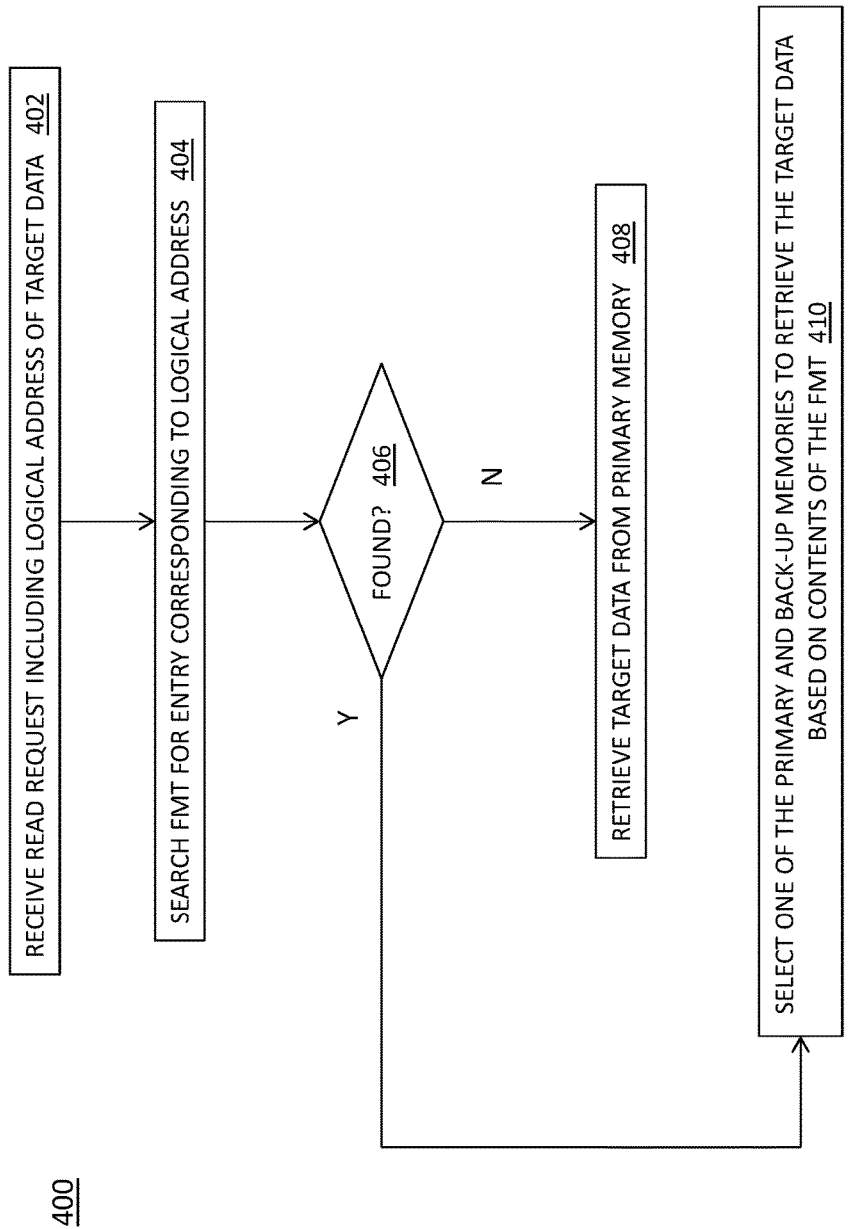
FIG. 4 illustrates a flow diagram of a method for optimizing the performance of read functions in a memory system in accordance with an embodiment.

FIG. 4 illustrates a flow diagram of a method 400 for optimizing the performance of read functions in accordance with an embodiment. The depicted blocks may be part of or in addition to another process and/or may be performed in any suitable order to provide optimized performance of read functions. The method 400 can be implemented for a variety of memory system configurations and is described in reference to FIGS. 1-3. For instance, the method 400 can be performed by the memory controller 202, one or both of memories 210A and 210B, or by one or more non-volatile memory devices 204A and 204B.

At block 402, the memory system 200 receives a read request including a logical address of a target data. The read request is received from a computer processor (e.g., computer processor 102 of FIG. 1).

At block 404, the memory system 200 (e.g., via the memory controller 202) searches the FMT 214 for an entry corresponding to the received logical address. Each of the entries in the FMT 214 indicates a physical location of identified memory failure events in the primary memory 210A and the back-up memory 210B.

At block 406, the memory system 200 determines whether an entry corresponding to the received logical address is found in the FMT 214. If not, this means that no memory failure events were detected at the physical address of the target data in either the primary memory 210A or the back-up memory 210B. In this instance, the read request is directed to the primary memory 210A for retrieving the target data at block 408. Alternatively, the read request may be directed to one of the memories 210A or 210B based on a default function.

However, if no entry corresponding to the received logical address is found in the FMT 214 at block 406, this means that a memory failure event has been identified for the respective physical address of the target data. In this instance, the memory system 200 handles the read request based on the contents of the FMT table 214. In an embodiment, criteria may be established for determining which of the primary memory 210A and the back-up memory 210B to use for directing read requests. The criteria may be based on the type or severity of memory failure event identified (chip mark or symbol mark), or may be based on a frequency of errors detected for a particular memory device associated with the target data. The FMT 214 stores the memory failure event information (e.g., type of failure event, frequency of detection of the failure event, etc.). Thus, at block 410, the memory system 200 determines which of the primary memory 210A and the back-up memory 210B the read request will be directed.

In an embodiment, the memory system 200 is configured to receive the memory failure event information when it occurs or has been discovered, and store the memory failure event information in the FMT 214. For example, the memory system 200 receives an indication from one of the primary memory 210A and the back-up memory 210B of a symbol mark or chip mark for a memory device (one of memory devices 1-N in FIG. 2). The memory system 200 enters the memory event failure information in an entry of the FMT 214. The memory failure information includes the physical location (e.g., physical address of the memory device and an identifier of which of the primary memory 210A or back-up memory 210B the memory failure event is located) in columns 302 and 304. The memory failure event information may also include the type of error (e.g., symbol mark or chip mark) and bit errors in columns 306 and 308, and/or other useful information, such as the frequency of occurrence of the error for a particular memory device in column 310.

Likewise, when the memory system 200 receives a correction notice or indicator that one of the symbol marks or chip marks has been resolved (e.g., from the ECC unit), the memory system 200 updates the FMT 214 to remove the corresponding entry.

Technical effects include performance optimization of read functions in a memory system by tracking memory failure event information including corresponding primary and back-up memories in which the memory failure event occurred, and retrieving requested data from the unaffected memory, thereby minimizing the latency otherwise incurred when request for data is first issued to a memory affected by a memory failure event.

The present invention may be a system, a method, and/or a computer program product. The computer program product may include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A memory system, comprising:
   a primary memory;
   a back-up memory that mirrors the primary memory;
   a fault monitor table; and
   a memory controller operably coupled to the primary memory, the back-up memory, and the fault monitor table, the memory controller configured to:
   search the fault monitor table for an entry corresponding to a logical address, the fault monitor table comprising a plurality of entries that indicate physical locations of identified memory failure events in the primary memory and the back-up memory;
   based on locating an entry corresponding to the logical address, select one of the primary memory and the backup memory for retrieving data stored at the logical address, the selection based on contents of the fault monitor table;
   receive a correction notice from an error correction code unit of one of the primary memory and the back-up memory in which one of the memory failure events has been corrected, wherein the correction notice indicates correction of the one of the memory failure events; and remove an entry in the fault monitor table corresponding to the one of the memory failure events.

2. The system of claim 1, wherein the memory controller is further configured to:
receive an indication from one of the primary memory and back-up memory of an identified memory failure event; and
populate the fault monitor table with a physical address of the identified memory failure event along with an identification of the one of the primary memory and the back-up memory for which the memory failure event was identified.

3. The system of claim 1, wherein the memory controller is further configured to:
receive criteria for determining which of the primary memory and the back-up memory read requests will be transmitted, the criteria determined as a function of a number or severity of the memory failure events attributed to a corresponding memory device storing the target data.

4. The system of claim 1, wherein the memory controller is further configured to:
based on determining the location does not match one of the physical addresses in the fault monitor table, direct the read request according to a default function.

5. The system of claim 1, wherein the fault monitor table resides in the memory controller.

6. A computer program product for optimizing performance of read functions in a memory system including a primary memory and a back-up memory that mirrors the primary memory, the computer program product comprising:
a non-transitory computer readable storage medium having program instructions embodied therewith, the program instructions readable by a processing circuit to cause the processing circuit to perform a method comprising:
searching a fault monitor table for an entry corresponding to a logical address, the fault monitor table comprising a plurality of entries that indicate physical locations of identified memory failure events in the primary memory and the back-up memory;
based on locating an entry corresponding to the logical address, selecting one of the primary memory and the backup memory for retrieving data stored at the logical address, the selecting based on contents of the fault monitor table;
receiving a correction notice from an error correction code unit of one of the primary memory and the back-up memory in which one of the memory failure events has been corrected, wherein the correction notice indicates correction of the one of the memory failure events; and
removing an entry in the fault monitor table corresponding to the one of the memory failure events.

7. The computer program product of claim 6, wherein the program instructions are further configured to cause the processing circuit to perform:
receiving an indication from one of the primary memory and back-up memory of an identified memory failure event; and
populating the fault monitor table with a physical address of the identified memory failure event along with an identification of the one of the primary memory and the back-up memory for which the memory failure event was identified.

8. The computer program product of claim 6, wherein the program instructions are further configured to cause the processing circuit to perform:
receiving criteria for determining which of the primary memory and the back-up memory read requests will be transmitted, the criteria determined as a function of a number or severity of the memory failure events attributed to a corresponding memory device storing the target data.

9. The computer program product of claim 6, wherein the program instructions are further configured to cause the processing circuit to perform:
based on determining the location does not match one of the physical addresses in the fault monitor table, directing the read request according to a default function; and
receiving a correction notice from an error correction code unit of one of the primary memory and the back-up memory in which one of the memory failure events has been corrected.

10. The computer program product of claim 6, wherein the fault monitor table resides in the memory controller.

* * * * *